(12) United States Patent
Satyanarayana

(10) Patent No.: US 6,737,958 B1
(45) Date of Patent: May 18, 2004

(54) CROSSPOINT SWITCH WITH REDUCED POWER CONSUMPTION

(75) Inventor: Srinagesh Satyanarayana, Brewster, NY (US)

(73) Assignee: Free Electron Technology Inc., Austin, TX (US)

( * ) Notice: Subject to any disclaimer, the term of this patent is extended or adjusted under 35 U.S.C. 154(b) by 592 days.

(21) Appl. No.: 09/714,706

(22) Filed: Nov. 16, 2000

(51) Int. Cl.$^7$ .............................................. H03K 17/693
(52) U.S. Cl. .................................... 340/14.1; 340/2.28
(58) Field of Search .......................... 340/14.1, 14.69, 340/14.4, 2.28, 2.26, 2.23; 327/407, 99, 538, 362; 330/253, 257

(56) References Cited

U.S. PATENT DOCUMENTS 5,506,543 A * 4/1996 Yung ........................... 330/253
6,501,327 B1 * 12/2002 Tam ............................. 327/538

OTHER PUBLICATIONS

TQ8016 datasheet (Triquint Semiconductor, Inc).*

* cited by examiner

Primary Examiner—Michael Horabik
Assistant Examiner—William Bangachon
(74) Attorney, Agent, or Firm—Adams & Wilks

(57) ABSTRACT

A crosspoint switch architecture implements high-speed packet switches and incorporates a power-saving bias control circuit with each switch cell. Each switch cell is equipped with two memory cells and a bias control circuit. Power savings are obtained by controlling the bias current of the switch cell as a function of the switch state. Although the additional circuitry accompanying each switch cell adds complexity and a minimal additional power consumption, the power saving realized in the switch cell results in a crosspoint switch with much lower power consumption as compared to existing architectures. The presence of two bits of memory for each switch core allows for fast reconfiguration. The result is an overall power savings and lower cost design.

29 Claims, 10 Drawing Sheets

CROSSPOINT SWITCH WITH REDUCED POWER CONSUMPTION

FIELD OF THE INVENTION

The present invention relates generally to a crosspoint switch, and, more particularly, to a crosspoint switch having a power-saving bias control circuit for controlling the bias current of each switch core as a function of switch state to minimize the power consumption of the crosspoint switch, and optionally having two memory cells associated with each switch core for reducing the reconfiguration time of the crosspoint switch.

BACKGROUND OF THE INVENTION

Recent trends in data communications have necessitated the development of high-speed, reconfigurable data switches capable of routing signals to any of plural locations. Also, a known method for enhancing the processing power of a given technology is through the use of multiple processors sharing memory and input/output devices that are coupled together in a wideband communication network having a bandwidth in the range of multiple gigabits per second. In such applications, where the throughput rate of exchanging and sharing data needs to be maximized, it is desirable to have a non-blocking circuit switch that allows simultaneous data traffic at the network bandwidth. The key data routing function in such data networks is frequently performed by crosspoint switches, which allow incoming data streams to be routed to specified output channels.

Generally, a crosspoint switch for N-ports with N input and N output links consists of N×N switch elements and corresponding latches that store switch setup or connection information provided by a switch controller. Crosspoint switches are used in many applications requiring reconfigurable high-speed switch networks. A crosspoint switch is an electronic circuit that is designed to receive one or more input signals at one or more input terminals and route the signals to one or more output terminals. A controller external to the switch network is generally used to reconfigure the crosspoint switch to change the routing of the input signals to different output terminals. The function of a crosspoint switch is shown schematically in FIG. 1, which is a simplified block diagram illustrating the matrix fabric of a 4×4 array type crosspoint switch. Data inputs $IN_1$–$IN_4$ enter from the left-hand side through input buffers 10, and data outputs $OUT_1$–$OUT_4$ exit from the bottom through output buffers 12. Switch elements 14, which are typically pass-gate type elements such as FETs, provide reconfigurable, non-blocking paths from the inputs to the outputs.

The crosspoint switch is an important building block for digital communications systems that are required to share expensive resources. Such switches have been used in a wide range of systems, from workstations to computer networks, packet data networks and voice (circuit and packet) switching networks. Most recently, the shift towards graphical and video information display coupled with the widespread popularity of the Internet have significantly increased the demand for bandwidth and connectivity. Although this demand can be met by increasing the number of parallel connections in a given communication system, economic factors have favored increasing the bandwidth in each connection. This is especially true with respect to fiber optic lines, which provide a particularly high-speed data communications pathway with a wide bandwidth. As a result, there is significant demand in current network applications for crosspoint switches capable of delivering multi-gigabit per second performance for each channel.

While the telephone network was originally designed for voice communications, it has been evolving into a digital network for the transmission of audio, internet data and video data. During the 1980's, new international broadband data communications standards for voice and data were formed. The resulting Synchronous Optical Network (SONET/North America), and Synchronous Digital Hierarchy (SDH/Europe and Asia) standards were defined to accommodate increasing bit rates. The baseline rate for SONET (OC-1) is 51.84 Mbps and the baseline rate for SDH (STM-1) is three times OC-1 or 155.52 Mbps. Currently, telcom networks operating up to OC-12 (OC-1×12) and OC-48 (2.5 Gbps) are in widespread deployment. Crosspoint switches are an integral part of such networks. Crosspoint switches for OC-12 and lower bit rates can be readily realized with silicon-based BJT or CMOS VLSI technology. One such crosspoint switch which is commercially available is model TQ8025, available from Triquint, the datasheet of which is incorporated herein by reference. At bit rates in the multi-gigabit per second range, various approaches have been used to combat effects associated with high-frequency communications, such as excessive power dissipation, jitter and crosstalk.

The explosive demand for broadband Internet access has fueled the need to increase the bandwidth of telcom networks. At present, GaAs laser drivers, preamplifiers and the like are capable of addressing bit rates of over OC-48 (2.488 Gbs) and OC-192 (9.953 Gbs), and advanced III–IV technologies are addressing OC-768 (39.13 Gbs) and higher. Crosspoint switches capable of accommodating these bit rates are needed to transform a link into a network in order to meet the connectivity requirement.

FIG. 1 illustrates the most natural realization of a crosspoint switch, which is the so-called matrix or array architecture. In the matrix architecture, a matrix of n inputs by m outputs is interconnected with switch elements 14 at each intersection. FIG. 2 is a simplified block diagram illustrating a typical crosspoint switch 200 having a matrix architecture. The crosspoint switch 200 includes input terminals $IN_1$–$IN_N$ coupled to receive corresponding input signals. The crosspoint switch 200 also includes output terminals $OUT_1$–$OUT_N$, to provide corresponding output signals. The crosspoint switch circuit 200 is used to selectively route one or more of the input signals received at the input terminals $IN_1$–$IN_N$ to one or more output terminals $OUT_1$–$OUT_N$. An input buffer 202 is connected to each input terminal $IN_1$–$IN_N$, the output of which is connected to an input lead of each of a row of substantially identical switch cores 204. Thus, each input terminal is connected to all of the switch cores 204 in a given row. Similarly, each output terminal $OUT_1$–$OUT_N$ is connected to all of the switch cores 204 in a corresponding column of switch cores 204 through an output buffer 206. A switch configuration control circuit 208 has an input port 210 coupled to receive configuration control signals CONFIG from an external controller (not shown), through which the external controller configures each crosspoint switch core 204. The configuration control signals CONFIG are typically serial multi-bit signals that include the configuration information on an input-to-output basis (i.e., for each input signal, the configuration control signals CONFIG control which output terminal or terminals the input signal is to be routed to). Of course, the control signals can be multi-bit parallel signals. In response to the configuration control signals, control logic in the switch configuration control circuit 208 configures each switch core 204 to select one of the input signals and provide an output signal dependent on the selected input signal to output terminals $OUT_1$–$OUT_N$, respectively. In some applications of the crosspoint switch 200, one or more of input terminals $IN_1$–$IN_N$ and one or more of output terminals $OUT_1$–$OUT_N$ are not used.

As a general rule, no two inputs of the crosspoint switch can be routed to the same output at the same time. This would constitute a contention. However, one input can be connected to several outputs. This is referred to as the broadcast mode. In either case, the total number of switches that are actually routing data for a 16×16 switch is no more than 16. In any given configuration, no more than 16 switches are always on.

To configure each switch core 204, switch configuration control circuit 208 includes output leads (not shown) respectively connected to each switch core 204. The switch configuration control circuit 208 provides a select signal to configure each switch core 204.

Referring to FIG. 3, the structure of the switch cores 204 in a typical matrix type crosspoint switch 200 and the manner in which the switch cores 204 are controlled by the switch configuration control circuit 208 is now described. In FIG. 3, the switch configuration control circuit 208 is represented by individual blocks labelled "Switch State Control" to illustrate the individual control of each switch core performed by the switch configuration control circuit 208. As will be appreciated, in a conventional matrix type crosspoint switch, the structure performed by the "Switch State Control" blocks shown in FIG. 3 is contained in the switch configuration and control circuit 208. As is typical of crosspoint switches designed for use in high speed applications, the input signals and output signals are differential signals. Also, the switch core 204 of the crosspoint switch 200 comprise two-level differential amplifiers, and the configuration control signals output by the switch configuration control circuit 208 are differential signals.

Each of the switch cores 204 has a bias transistor Q1 300 which has an emitter connected to a power source VSS 302 (which is ground potential in the example shown in FIG. 3) through a resistor 304. The base of the bias transistor Q1 300 is connected to a bias voltage $V_{bias}$ which has a level dependent upon the nature of the transistors used in the switching core 204. The bias voltage $V_{bias}$ is applied at all times during operation of the crosspoint switch 200, even when the respective switch core 204 is OFF (not routing an input to an output). The collector of the bias transistor Q1 300 is connected to a lower differential pair 306 comprised of transistors Q2 and Q3. The lower differential pair 306 is used for current steering and controls the output state of the respective switch core 204 by diverting current through either one of a top differential pair 308 formed of transistors Q4 and Q5 (switch "ON") or supply voltage (switch "OFF"). In the top differential pair 308, the transistor Q4 has its base connected to a respective one of the differential input signals $IN_K$ through a corresponding input buffer 202 and its emitter connected to the collector of the transistor Q2. Transistor Q5 of the top differential pair has its base connected to the other of differential input signal $IN_K$ through an input buffer 202 as shown in FIG. 2 and its emitter connected to the collector of the transistor Q2. The collectors of the transistors Q4 and Q5 are connected to a respective one of the output pairs $OUT_1$–$OUT_{16}$. As can be seen, the collectors of the top differential pair of each of the switch cores are also tied to pull-up resistors 310 and 312, respectively. Each switch core 204 connected to the same output has the same structure, and the outputs of each switch core 204 connected to the same output line are thus arranged in a "wired OR" configuration.

When the switch core 204 is in an ON state, the bottom differential pair 306 formed of the transistors Q2 and Q3 serves to divert current through the top differential pair 308 formed of the transistors Q4 and Q5 so that the top differential pair 308 transfers the differential input signals to the output during the "ON" state of the switch. When the switch core 204 is in an OFF state, the bottom differential pair 306 serves to divert current from the positive supply through the bias transistor Q1 300.

Due to the large number of independently driven switches, the matrix design crosspoint switch is inherently non-blocking and has the ability to broadcast each input to as many outputs as desired. At relatively low bit rates, the matrix architecture is best realized with FET or CMOS technology where pass gates are used as the switching elements. The primary advantage of the matrix type crosspoint switch is its potential to pass both small-signal analog and digital signals since the "ON" FET can be thought of as a somewhat linear low-value resistor connecting an input to an output. The matrix architecture is extensively employed in commercial low-speed analog/digital switches.

At high speeds, the matrix architecture has several key limitations for digital signals. Since the input and output lines need to be connected to a larger number of nodes, the interconnect lines tend to be long which results in a large capacitance that is difficult to drive at a high speed with low jitter. In addition, both the input and output interconnects are attached to a large number of "OFF" devices, which further increases the load capacitance of the driving stage. In the pass-gate configuration, the active device does not have much gain or drive capability; thus, the input drive stage needs to drive all of the parasitic capacitance from the input to the output. The situation can be significantly improved by placing buffers between each crosspoint; however, this further increases the size, transistor count, power dissipation and complexity of the circuit. Due to these limitations, many high-speed crosspoint switches use alternative designs.

Accordingly, there is a need for a matrix architecture capable of providing high-speed bit rates which overcomes the foregoing problems.

The so-called multiplexer type crosspoint switch is a conventional alternative to the matrix architecture employed in high-speed crosspoint switches. In a multiplexer type crosspoint switch, the inter-stage buffering and the switching functions are combined into one stage through the use of digital multiplexers (MUXes). A multiplexer (MUX) serves to route one of its inputs to a selected output based on the control code provided. FIG. 4 illustrates the topology of a typical 16×16 crosspoint switch 400 using sixteen 16:1 MUXes 402 connected in parallel. The crosspoint switch 400 includes input terminals $IN_1$–$IN_{16}$ coupled to input buffers 404 to receive input signals. The crosspoint switch 400 also includes output terminals $OUT_1$–$OUT_{16}$, where the crosspoint switch 400 provides output signals. The crosspoint switch circuit 400 is used to selectively route one or more of input signals received at the input terminals $IN_1$–$IN_{16}$ to one or more output terminals $OUT_1$–$OUT_{16}$ through output buffers 406.

In the multiplexer type crosspoint switch 400, each input terminal $IN_1$–$IN_{16}$ is connected to a corresponding input lead of each of sixteen substantially identical 16:1 multiplexers 402, so that each input terminal $IN_1$–$IN_{16}$ is connected to all of the multiplexers 402. A MUX configuration control and memory circuit 408 has an input port 410 coupled to receive configuration control signals CONFIG from an external controller (not shown), through which the external controller configures the crosspoint switch circuit 400. The configuration control signals CONFIG are typically serial multi-bit signals that include the configuration information on an input-to-output basis (i.e., for each input signal, the control signals control which output terminal or terminals the input signal is to be routed to). Of course, the configuration control signals CONFIG can be multi-bit parallel signals. In response to the configuration control signals, the MUX configuration control and memory circuit 408 configures each multiplexer 402 to select only one of the input signals and provide an output signal dependent on the selected input signal to one or more of the output terminals $OUT_1$–$OUT_{16}$, respectively. In some applications of the crosspoint switch 400, one or more of input terminals $IN_1$–$IN_{16}$ and one or more of output terminals $OUT_1$–$OUT_{16}$ are not used.

To configure each multiplexer 402, the MUX configuration control and memory circuit 408 includes output leads $412_1$–$412_{16}$ respectively connected to a select input lead SEL of the multiplexers 402. The MUX configuration control and memory circuit 408 provides a 4-bit serial select signal to configure each multiplexer to select one of the 16 input terminals $IN_1$–$IN_{16}$. In an N×N crosspoint switch, each select signal is typically a K-bit signal (where $N=2^K$) so that the MUX configuration control and memory circuit 408 configures each multiplexer 402 to select one of N input signals $IN_1$–$IN_N$. Multiplexers 402 then output the selected signals to the output terminals, respectively.

The MUX architecture is virtually identical to the matrix architecture with a MUX 402 replacing one of the output legs in the matrix. Each output $OUT_1$–$OUT_{16}$ is driven by one multiplexer 402 that has access to each of the 16 inputs. Since each output has its own multiplexer 402, the crosspoint switch 400 is both non-blocking and has the ability to operate in broadcast mode, where one input is connected to several outputs. Furthermore, unlike the matrix type architecture where each switch core needs to be independently switched, each multiplexer is digitally programmable. This allows simplification of the control logic.

FIG. 5 illustrates the basic structure of the switch core of a typical 2:1 MUX of a multiplexer type crosspoint switch. In the crosspoint switch 400 of FIG. 4, each multiplexer 402 routes each of the inputs to a selected output. Inside each 16:1 multiplexer 402, a stacked configuration of differential pairs is used. A bottom differential pair 500 comprising transistors Q8 and Q9 diverts bias current from one of two top pairs 502, 504. A first top differential pair 502 formed of transistors Q12 and Q13 routes a selected input $IN_K$ to a selected output and a second top differential pair 504 comprising transistors Q10 and Q11 routes another input $IN_J$ to the output. This is a typical embodiment of a 2:1 MUX. By stacking a third pair, a 4:1 MUX can be implemented. Although stacking can be indefinitely extended in theory, power supply levels limit the stack size. For example, 3–4 level stacks are common in a 5.2V system. The recent trend in crosspoint switches is to lower power supply voltages (e.g., 3.3V), which does not allow for more than 2 or 3 levels of stacks. Larger multiplexers are thus constructed by cascading several lower order MUXes. For example, FIG. 6(*a*) shows the construction of a 4:1 MUX using 3 2:1 MUXes, and FIG. 6(*b*) shows the construction of a 16:1 MUX using 5 4:1 MUXes (or 15 2:1 MUXes. Cascaded approaches typically have improved performance over, for example, a one-stage 16:1 multiplexer at the expense of increased power dissipation. For instance, the power dissipation of a 4:1 MUX is the sum of the power dissipation of all three 2:1 MUXes. Since each differential pair is in use at all times, however, there is no margin for power management. Thus, multiplexer type crosspoint switches typically require a higher operating voltage level than array type crosspoint switches.

The main function of a crosspoint switch is to provide reconfigurable, user-specified routing paths from a set of inputs to a set of outputs. To perform this function, some form of memory storage is typically associated with each crosspoint switch core to store a current routing configuration pattern. The memory contents are used to open or close switches in the switching array. A one bit memory can be associated with each of these switches and if the bit is at a logic "1" level, for example, then the switch is ON and at a logic "0" level, the switch is OFF. Of course, the logic level used to turn switch elements ON and OFF will vary depending upon the conductivity type of the transistor element used to implement the switch. In actual implementations, the memory requirement of the crosspoint switch elements is optimized through the use of coding. For example, a 16×16 matrix type crosspoint switch has 16 inputs and 16 outputs, with each of 16 MUXes requiring 4-bits of memory storage. The 16×16 MUX corresponds to 256 individual switch cores in an array architecture. Memory requirements for switch configuration storage in a 16×16 crosspoint switch thus vary from 64 bits to 256 bits.

The rate at which the crosspoint switch configuration is changed is typically several orders slower than the maximum data speed. In a typical environment, the configuration of the switch is set up by loading the configuration bits from a protocol processor (for packet networks) that decodes the packet addresses and the switch is then used for routing data in accordance with the pre-set configuration. In circuit switched telephone networks, the configuration bits are set by the call setup control logic. Thus, a small interruption in routing is presented when the switch configuration is altered.

While several implementations have been proposed for crosspoint switches, switch elements for high-speed applications (in the gigabit per second range) are generally implemented using bipolar, GaAs, FET or HBT technology to accommodate the need for handling high-speed switching. Input buffers are used to present a lower capacitance to the outside and drive the switch array. Output buffers provide the drive necessary to support the external load while presenting a low capacitance to the switch array. Bias circuits and configuration logic make up the remainder of the crosspoint switch, and configuration logic is generally implemented using CMOS transistors (for Silicon BiCMOS and SiGe BiCMOS technologies) and thus occupies a small space and dissipates little power. In GaAs technology, implementations of logic cannot take advantage of CMOS circuits. For high-speed implementations (in the Gbps range), inputs and outputs are usually implemented with differential circuits having 50Ω terminations. Internal circuits also use a differential configuration but not necessarily at a 50Ω impedance level. In addition, at high speeds, the switching transistors must be biased at high current levels, typically on the order of several mA. While lower speeds permit the use of pass-gate transistor type switches, differential amplifier type circuits are normally required to implement high-speed switches. The configuration and control circuits are usually implemented with lower power biasing or with CMOS circuits, which is well suited for logic and memory implementation, because the speed requirements are at least an order of magnitude lower.

Crosspoint circuits operating at high speeds dissipate large amounts of power because the transistors used for switching are biased at high currents to enable them to achieve high switching speeds. In some high-speed crosspoint switch circuits, the high-speed circuitry implementing the crosspoint switch cores has a significant static power dissipation (i.e., the power dissipation of the circuitry while in a static or non-transitioning state). A typical switch used in data/packet switching can be of the size 16×16 or larger. Usually, switching systems use several such chips in an array configuration to implement large switching capabilities. The size of the switch realized on a chip is usually limited by the number of available pins, the power dissipation of the switch array, and the yield that can be obtained during manufacture. If switches can be implemented at lower power, the chip size and cost of the packaging can be lowered and the size of the switch is limited only by the number of required pins and manufacturing considerations.

In the gigabit per second range, most known implementations use either the array type architecture or the multiplexer type architecture having switch implementations as shown in FIGS. 1–3 and FIGS. 4–6(a) and 6(b), respectively. In the array architecture (FIG. 3), Q1 is the bias transistor, and the bottom differential pair 306 comprised of transistors Q2 and Q3 control the switch state by diverting the current through the top differential pair 308 Q4 and Q5 (switch "ON") or to the positive supply (switch "OFF"). The top differential pair 308 transfers the inputs to the outputs during the "ON" state of the switch. A major disadvantage of this approach is that the switch cores are always biased, even when they are in an OFF state. The total static power dissipation of the chip can be approximated by the following Equation (1):

$$\text{Total Power Dissipation} = 256 \times (I_{bias} \times V_{bias}) + P_{diss} \text{ (control and config. circuit)} + P_{diss} \text{ (input and output buffers)} + P_{diss} \text{ (bias circuits)} \quad (1)$$

wherein $I_{bias}$ is the transistor bias current and $V_{bias}$ is the transistor bias voltage of transistor Q1.

At high speeds, $I_{bias}$ is high and the total static power dissipation becomes large. Particularly, in the gigabit per second range, the power dissipation of the switch cores becomes the dominant factor in the above-expressed equation. The power dissipation of the conventional crosspoint switch in high speed applications is on the order of 5 Watts, which necessitates expensive chip layout, special packaging considerations to accommodate the high power dissipation of the switch, and higher demands on reliability of the chips.

In the multiplexer architecture (FIGS. 4–6(a) and 6(b)), for instance, multiplexers are formed of a stacked configuration of differential pairs (FIG. 5). The bottom differential pair 500 comprising transistors Q8 and Q9 diverts bias current from one of the top two pairs. One of the two top differential pairs 502 (transistors Q12, Q13) routes a first input $IN_K$ to an output. The other top differential pair 504 (transistors Q10, Q11) routes a second input $IN_J$ to the output. This is a typical embodiment of a 2:1 MUX. By stacking a third pair, a 4:1 MUX is implemented, and cascading is used as shown in FIG. 6(b) to produce the 16:1 MUXes 402 shown in FIG. 4. The power dissipation of a 4:1 MUX comprising three stacked 2:1 MUXes is the total power dissipation of each of the individual MUXes. Since each differential pair is in use at all times, there is no margin for power management. Assuming that a 3 level stack implementation is used to realize a 4:1 MUX, and that a 16:1 MUX will require 5 such 4:1 MUXes, the total static power dissipation of such an implementation may be approximated by the following Equation (2):

$$\text{Total Power Dissipation} = 16 \times (5 \times I_{bias\_4:1 \, MUX} \times V_{bias}) + P_{diss} \text{ (control and config. circuit)} + P_{diss} \text{ (input and output buffers)} + P_{diss} \text{ (bias circuits)} \quad (2)$$

wherein $I_{bias\_4:1 \, MUX}$ is the bias current of each of the five 4:1 MUXes cascaded to form the 16:1 MUX, and is equal to 15 times the bias current of each of the cascaded 2:1 MUXes forming the 16:1 MUX.

Using this approach, the total static power dissipation of the multiplexer type crosspoint switch is slightly lower than that of the matrix architecture. Since the 16:1 MUX comprises 5 4:1 MUXes and 15 2:1 MUXex, the first factor in equation (2) is equivalent to 256×the bias current (×VEE) of the 2:1 MUX. While power dissipation at a given power supply voltage is slightly lower in the (MUX) architecture than the array architecture, the minimum power supply voltage of the multiplexer architecture is typically higher. MUX architecture based switches can be implemented using lower power supply voltages but at the expense of increased cascaded 2:1 Muxes and hence increased power dissipation. The delay through the system is proportional to the number of cascaded stages. In the 16×16 switch described above, 2 stages of 4:1 MUXes are used for realizing the 16:1 MUXes. The assumption of a 3 level stack is subject to the condition that adequate room is available in the power supply system. With a 3.3 V system, a 3 level stack would not be easy to implement if adequate room for voltage swing margins must be maintained.

Other major disadvantages are caused by the high power dissipation of conventional crosspoint switch architectures. While actual power dissipation depends on the choice of semiconductor technology and choice of power supply voltage levels, typical high-speed crosspoint switches have a total power dissipation level on the order of several Watts. Such devices have expensive packaging requirements, and generally require active cooling and ceramic packaging. At a power dissipation of about 1 Watt, the cost of packaging may be reduced significantly since active cooling and ceramic packaging can be avoided. High power dissipation also increases chip area, in that circuit wiring, and most notably power supply wiring, must be made wide enough to carry the several amperes of current necessary to drive the switch elements at the necessary switching rates. Utilizing single crosspoint switch chips as a building block, it is desirable to produce large switching matrices (for instance, in SONET applications). For example, 512×512 switches are not uncommon in current applications. A power dissipation per chip of several Watts requires individual chips to be spaced apart significantly to facilitate heat removal. Reduced power consumption can thus make a big difference in the cost and complexity of a given system. For a power dissipation of each module of more than 1 Watt, a given system increases in size and in capacitive and inductive loading to the input and output lines. Chips which dissipate several Watts typically have one-half their total number of pins/solder balls dedicated to the supply of power and ground lines to the chip. A reduction in power level of a chip from 5W to 1W allows a substantially lower the total pin/ball count.

Since there is only stage between each input and output in the array architecture, the delay from input to output is minimized. In the MUX architecture, delay is usually larger and is a function of the number of cascaded stages. Increased delay per chip can present obstacles in the design of large switch matrices using several chips.

SUMMARY OF THE INVENTION

In accordance with the present invention, a power-saving bias control circuit is provided in a crosspoint switch for controlling the bias of individual switch cores of the switch so that the respective switch cores are unbiased when not in use according to a given switch configuration. This reduces the static power dissipation of the crosspoint switch and enables the production of crosspoint switches having an increased number of switch cells with a reduced overall size.

In one embodiment, a matrix type crosspoint switch capable of being configured to reduce static power dissipation is provided. The crosspoint switch includes a plurality of input terminals, a plurality of output terminals, a plurality of input lines each being connected to a respective input terminal, a plurality of output lines each being connected to a respective output terminal, a plurality of switch cells connected to the input lines and the output lines, each switch cell containing a switch core for selectively connecting an input terminal to an output terminal and a bias control circuit for controlling a bias supplied to the switch core. The switch cores each have a control terminal and are arranged so that an input signal at any one of the input terminals may be routed to any one of the output terminals. The bias control circuit is configured to receive configuration information from an external controller and is responsive to the configuration information to provide a signal to the switch core to disable the switch core to substantially reduce the static power dissipation of the respective switch core.

Accordingly, the static power dissipation of disabled switch cells of the crosspoint switch is eliminated. The bias control circuit receives configuration information from an external controller and configures the switch cells in response to the configuration information. When configuring the switch cells, if instructed to do so, the bias control circuit selectively disables one or more of the switch cells, thereby substantially reducing the static power dissipation of the selectively disabled switch cell.

Although additional circuitry is added to each switch cell according to the present invention, the added complexity of the bias control circuit and the power consumption thereof result in a substantial reduction in overall power consumption of the crosspoint switch enabling the production of a crosspoint with greatly reduced power consumption than available with known implementations. Moreover, the additional circuitry is preferably implemented using CMOS transistors, to add only a small area overhead to the entire chip.

In another embodiment, a memory cell for storing two bits of data is added to each switch cell to provide for fast reconfiguration. A first memory bit is provided for storing a current switch configuration and a second memory bit is provided for storing a subsequent switch configuration. Thus, the present invention achieves a faster crosspoint switch having an overall power savings and a lower cost design.

By the foregoing structure, a reduction in power dissipation of a crosspoint switch from several Watts to approximately 1 Watt can be achieved, to thereby substantially reduce the cost of packaging by eliminating the need for active cooling and ceramic packaging of the crosspoint switch. In addition, the size of the wiring may be substantially reduced since the wiring layers need not be wide enough to carry large currents. When utilizing a crosspoint switch circuit according to the present invention as a building block for a network to produce larger switching matrices, the a lower power dissipation of the inventive crosspoint switch results in a substantial reduction in cost and complexity since the power dissipation of each module is reduced, thereby allowing devices to be placed closer, which avoids an increase in capacitive and inductive loading to the input and output lines.

BRIEF DESCRIPTION OF THE DRAWINGS

The foregoing aspects and many of the attendant advantages of the present invention will become more readily appreciated as the same become better understood by reference to the following detailed description, when taken in conjunction with the accompanying drawings, wherein:

FIG. 6(*b*) is a block diagram of a cascaded 16:1 MUX;

DETAILED DESCRIPTION OF THE PREFERRED EMBODIMENTS

Several implementations have been proposed for crosspoint switches. The present invention is described in terms of the array or matrix architecture and the multiplexer architecture, although those skilled in the art will recognize that the teachings of the present invention apply to other routing switch circuit architectures.

In accordance with one aspect of the present invention, an array type crosspoint switch capable of being driven at 3.3V or even as low as 2.5V and configured to reduce power dissipation is provided. The array type crosspoint switch includes a plurality of input lines, a plurality of output lines, a logic circuit and an array of switch cells each arranged at an intersection of an input line and an output line. The logic circuit receives switch configuration control data from an external controller and configures the switch cells of the array in response to the configuration information. The switch cells each have a switch core for connecting an input line and an output line and a bias circuit for providing a bias current to the switch core. When configuring the switch cells, the bias circuit selectively disables unused switch cores, thereby substantially reducing the power dissipation of the crosspoint switch.

In a preferred embodiment, an array architecture is used for the switch fabric. The path from each input to each output is mapped through a bias control switch having a power saving circuit. As in the conventional structure described above, the switching cores are implemented using a differential pair so that all switch cores connected to the same output have their differential pairs connected in a "wired-OR" configuration (all collectors connected to the same output are joined together). The joining point is pulled up by load resistors. The crosspoint switch is operated so that no two switch cores connected to the same output can be ON at the same time. The configuration control ensures that only the differential pair that represents an active connection is biased at the appropriate current. The remaining differential pairs are biased at zero current to conserve power.

Figure 7:
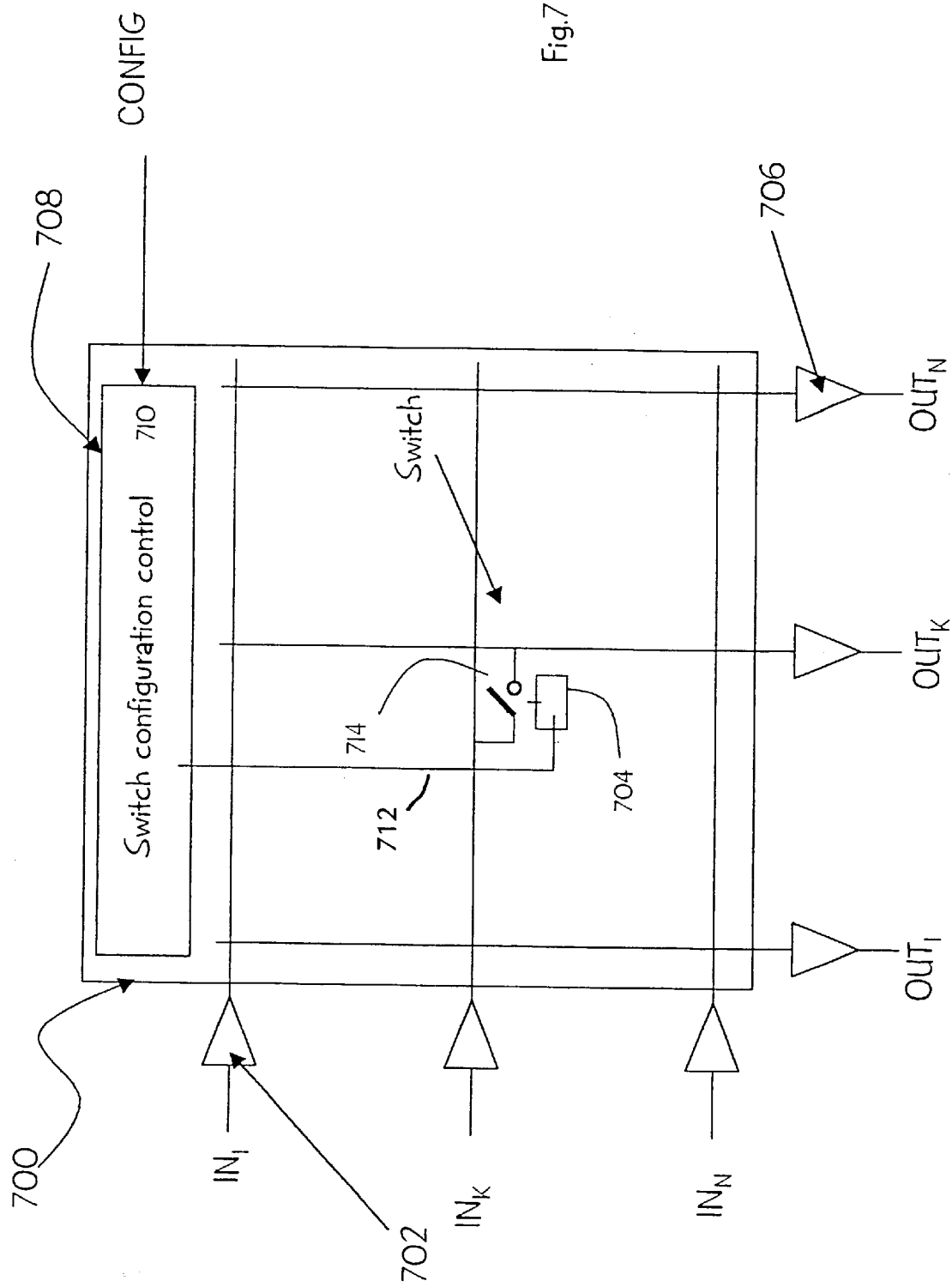
FIG. 7 is a block diagram of an embodiment of a crosspoint switch according to the present invention.

FIG. 7 is a matrix type crosspoint switch 700 in accordance with the first embodiment of the present invention. The crosspoint switch 700 includes input terminals $IN_1$–$IN_N$ coupled to receive input signals. The crosspoint switch 700 also includes output terminals $OUT_1$–$OUT_N$, where crosspoint switch 700 provides output signals. The crosspoint switch circuit 700 is used to selectively route one or more of N input signals received at input terminals $IN_1$–$IN_N$ to one or more of the output terminals $OUT_1$–$OUT_N$ as output signals.

An input buffer 702 is connected to each input terminal $IN_1$–$IN_N$, the output of which is connected to an input lead of each of a row of substantially identical switch cells (or switch cores) 704. Although only one switch cell 704 is illustrated in FIG. 7, it will be understood by those of ordinary skill in the art that an individual switch cell typically exists at each intersection of an input line and an output line. It will be further understood that while the crosspoint switch is shown as containing input lines and output lines arranged in a matrix, this is done for illustration purposes only. An actual matrix type crosspoint switch according to the present invention may contain a wiring layout which does not resemble a matrix.

In the illustrated embodiment, each of the input terminals is connected to all of the switch cells 704 in a given row. Similarly, each output terminal $OUT_1$–$OUT_N$ is connected to all of the switch cells 704 in a corresponding column of switch cells 704 through an output buffer 706. A switch configuration control and memory circuit 708 has an input port 710 coupled to receive configuration control signals CONFIG from an external controller (not shown), through which the external controller configures each crosspoint switch cell 704. The configuration control signals CONFIG are multi-bit signals serially input to the input port 710 and which include the configuration information on an input-to-output basis (i.e., for each input signal, the control signals CONFIG control which output terminal or terminals the input signal is to be routed to). In other embodiments, the configuration control signals may be multi-bit parallel signals.

In the illustrated embodiment, each of the input terminals is connected to all of the switch cells 704 in a given row. Similarly, each output terminal $OUT_1$–$OUT_N$ is connected to all of the switch cells 704 in a corresponding through an output buffer 706. A column of switch cells 704 bias control circuit 718, which in the illustrated embodiment is a switch configuration control and memory circuit, has an input port 710 coupled to receive configuration control signals CONFIG from an external controller (not shown), through which the external controller configures each crosspoint switch cell 704. The configuration control signals CONFIG are multi-bit signals serially input to the input port 710 and which include the configuration information on an input-to-output basis (i.e., for each input signal, the control signals CONFIG control which output terminal or terminals the input signal is to be routed to). In other embodiments, the configuration control signals may be multi-bit parallel signals.

To configure each switch cell 704, switch configuration control and memory circuit 708 includes a differential output lead 712 respectively connected to each switch cell 704. The switch configuration control and memory circuit 708 provides a select signal to configure each switch cell 704 through a corresponding output lead 712.

Each switch cell has associated therewith a memory device which is illustrated in the drawing as a switch 714 for selectively connecting a respective input terminal $IN_K$ to a selected output terminal $OUT_K$. As described below, the state of the memory device is controlled by the configuration control signal CONFIG output on a respective output lead 712 of the configuration control and memory circuit 708.

Figure 1:
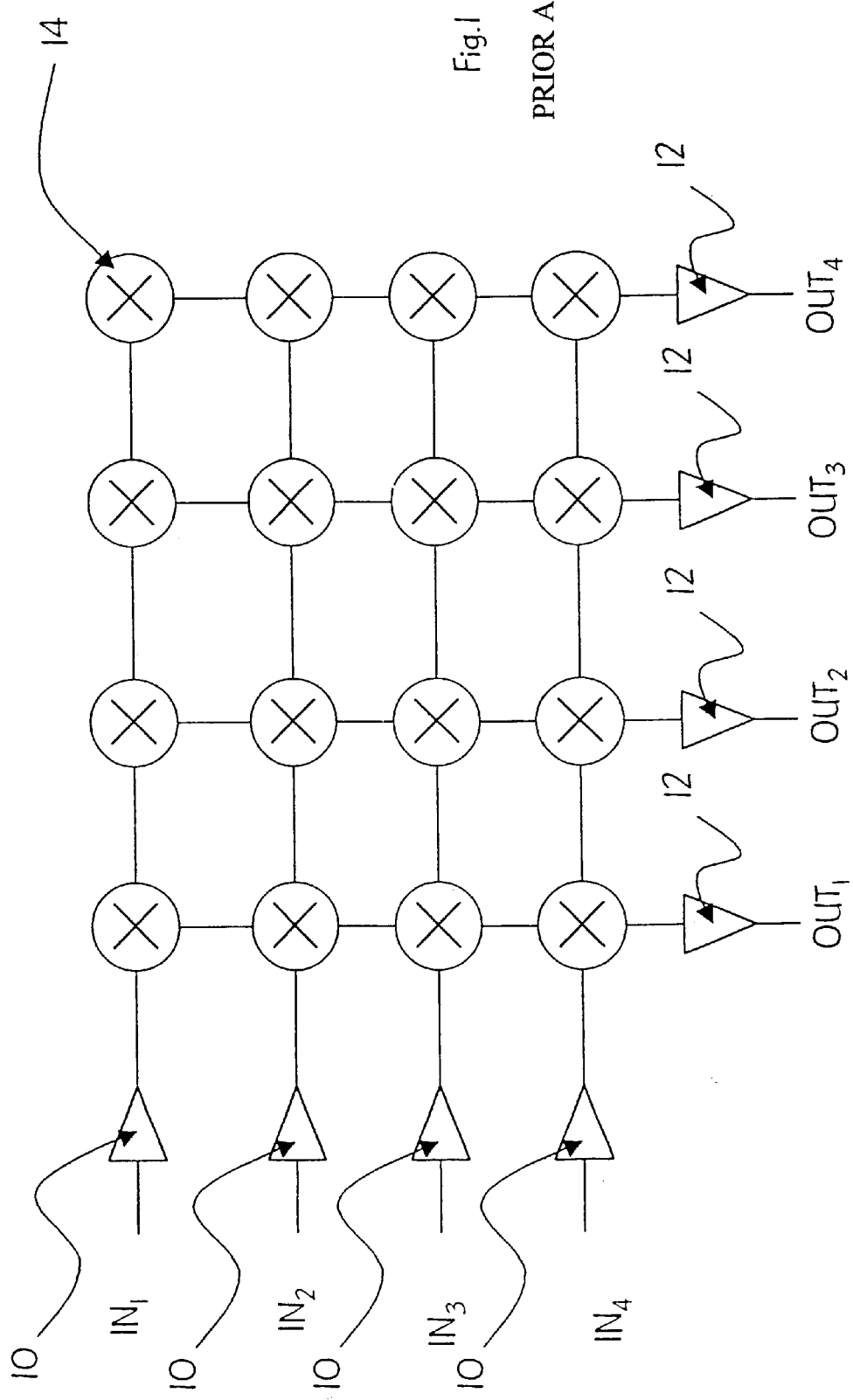
FIG. 1 is a simplified block diagram of a conventional crosspoint switch.
Figure 2:
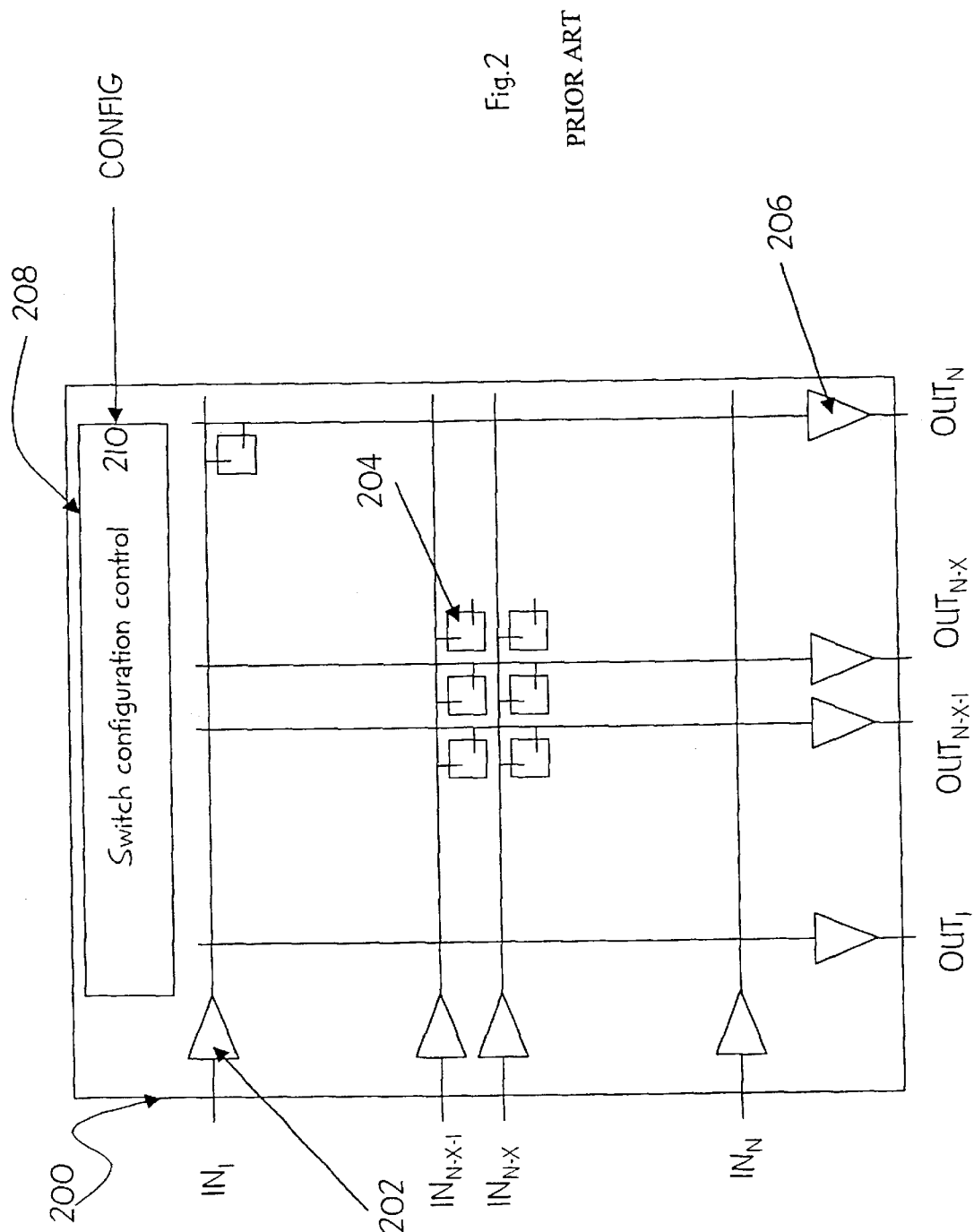
FIG. 2 is a block diagram of a conventional crosspoint switch having an array type architecture.
Figure 3:
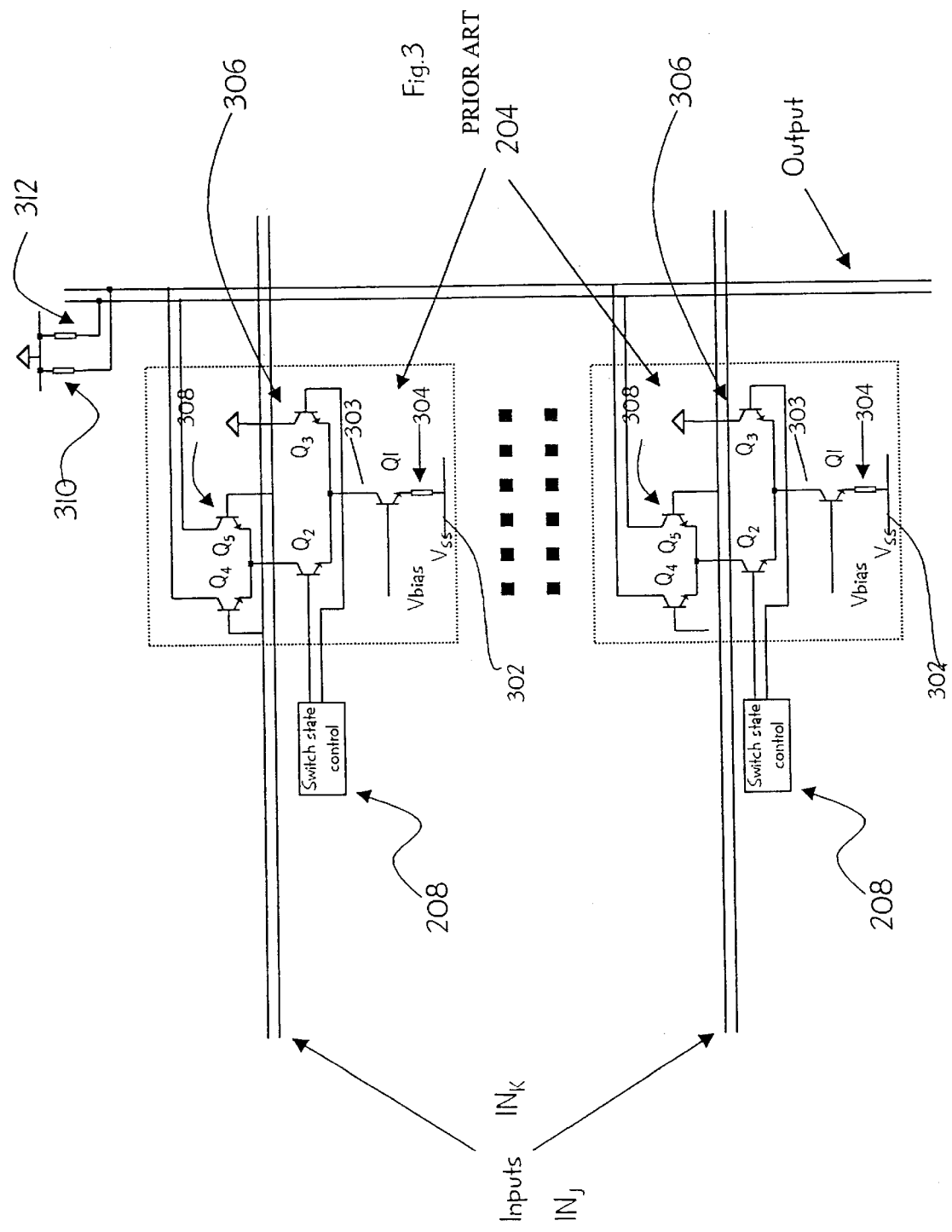
FIG. 3 is a diagram showing the structure of the switch cells and switch configuration control in the crosspoint switch of FIG. 2.
Figure 4:
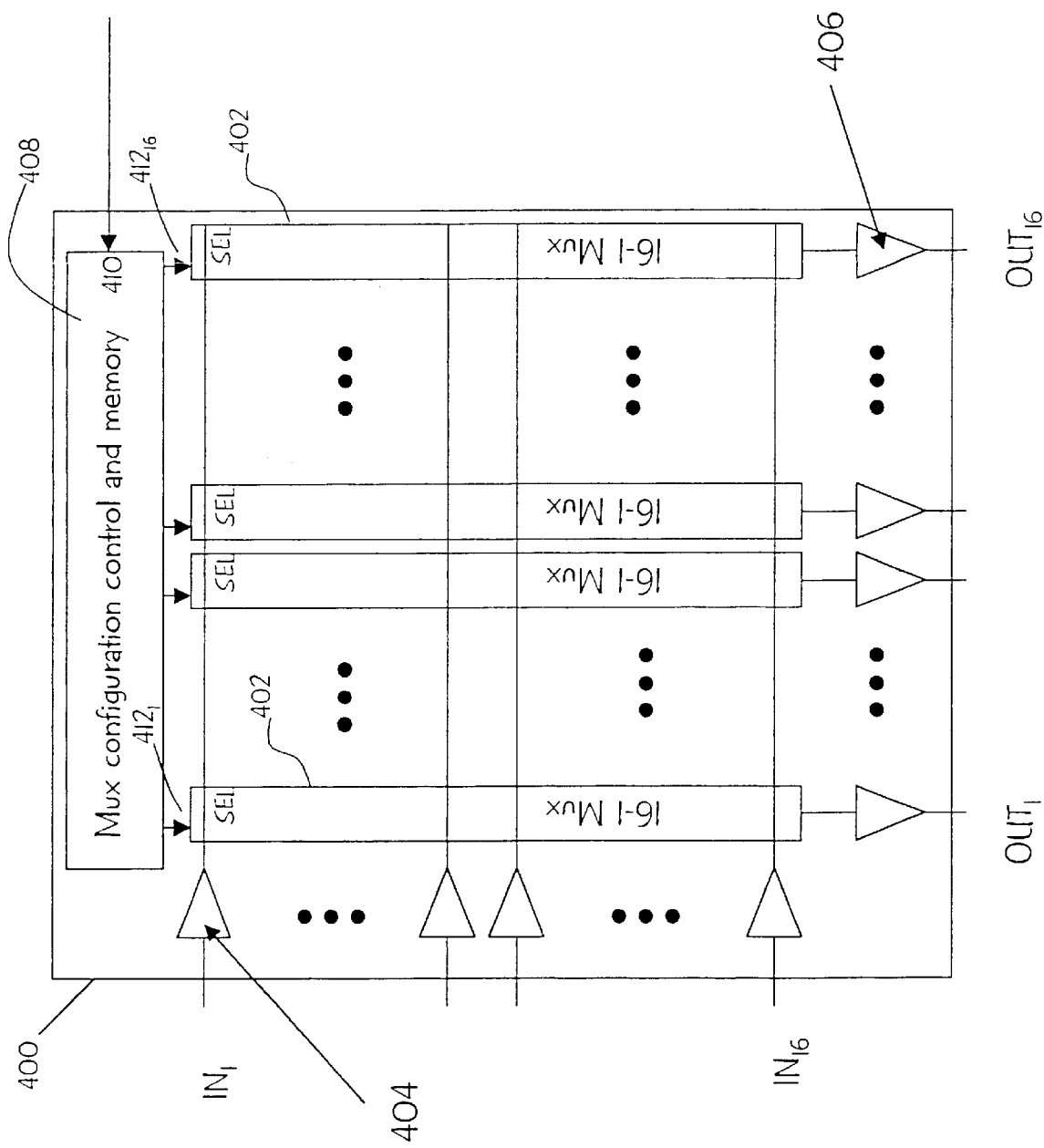
FIG. 4 is a block diagram of a crosspoint switch having a multiplexer architecture.
Figure 5:
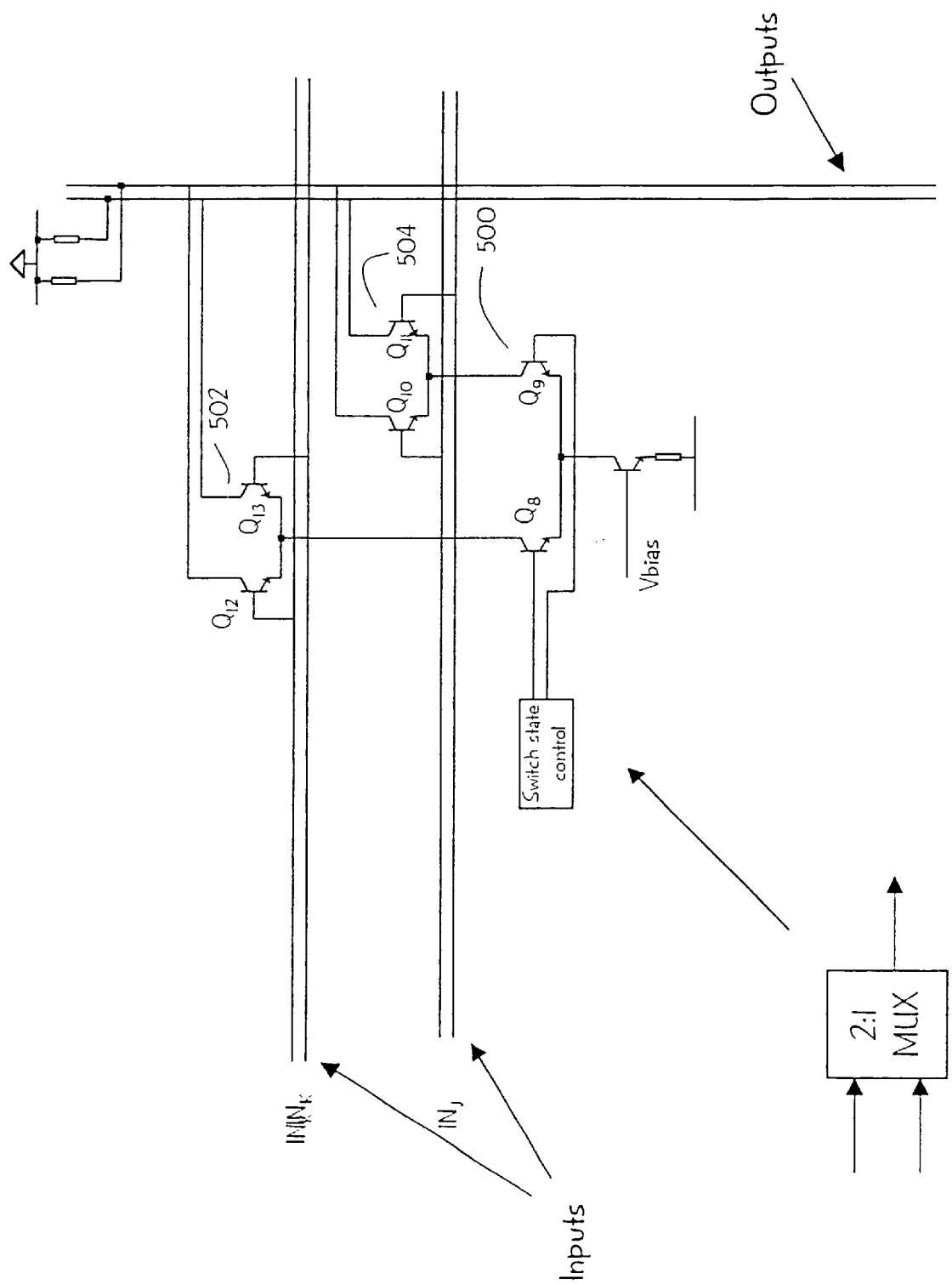
FIG. 5 is a diagram showing the structure of the multiplexers and multiplexer configuration control in the crosspoint switch of FIG. 4.
Figure 6A:
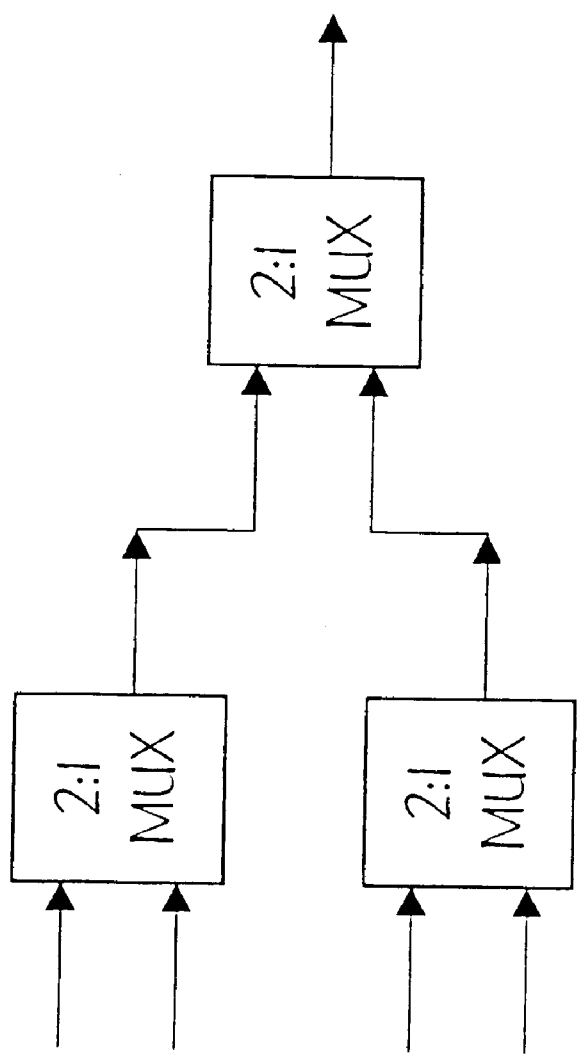
FIG. 6(*a*) is a block diagram of a cascaded 4:1 MUX.
Figure 6B:
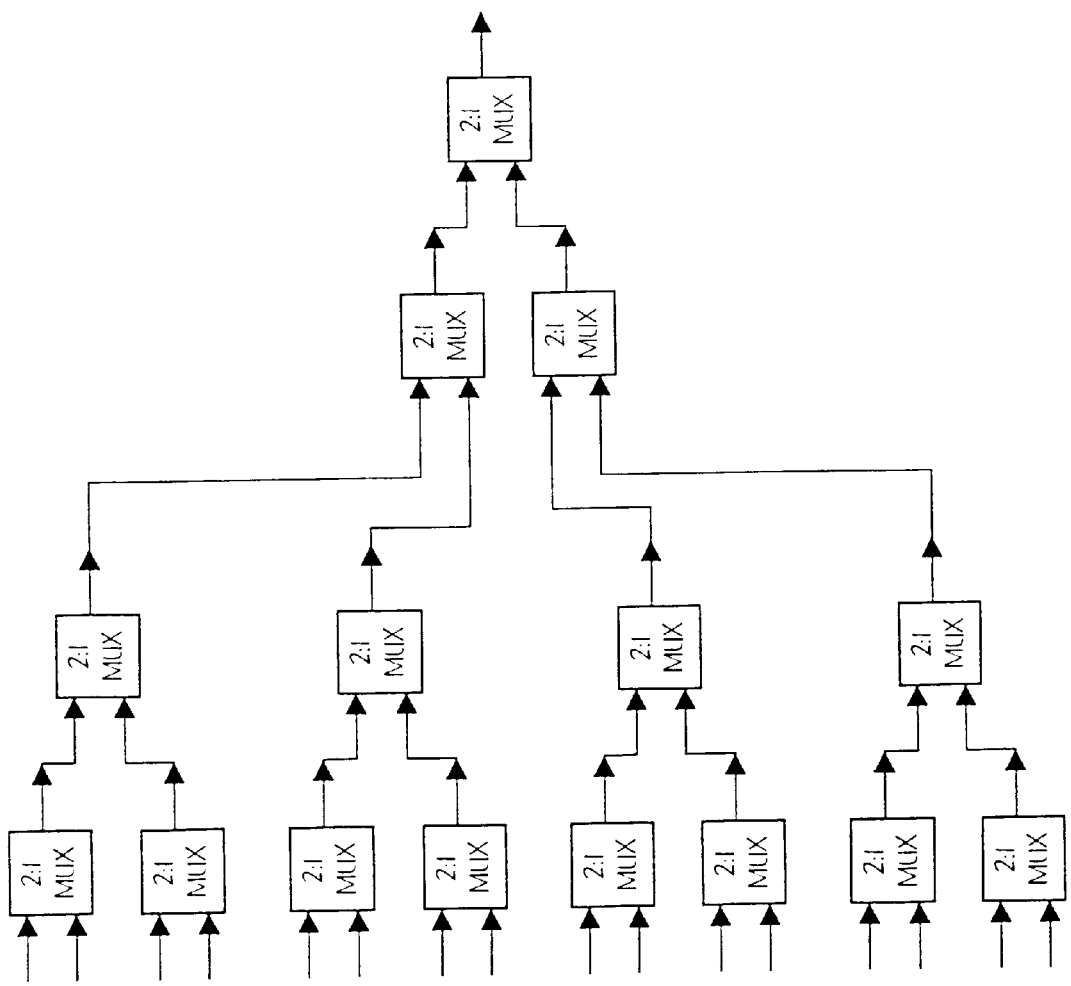
Figure 8:
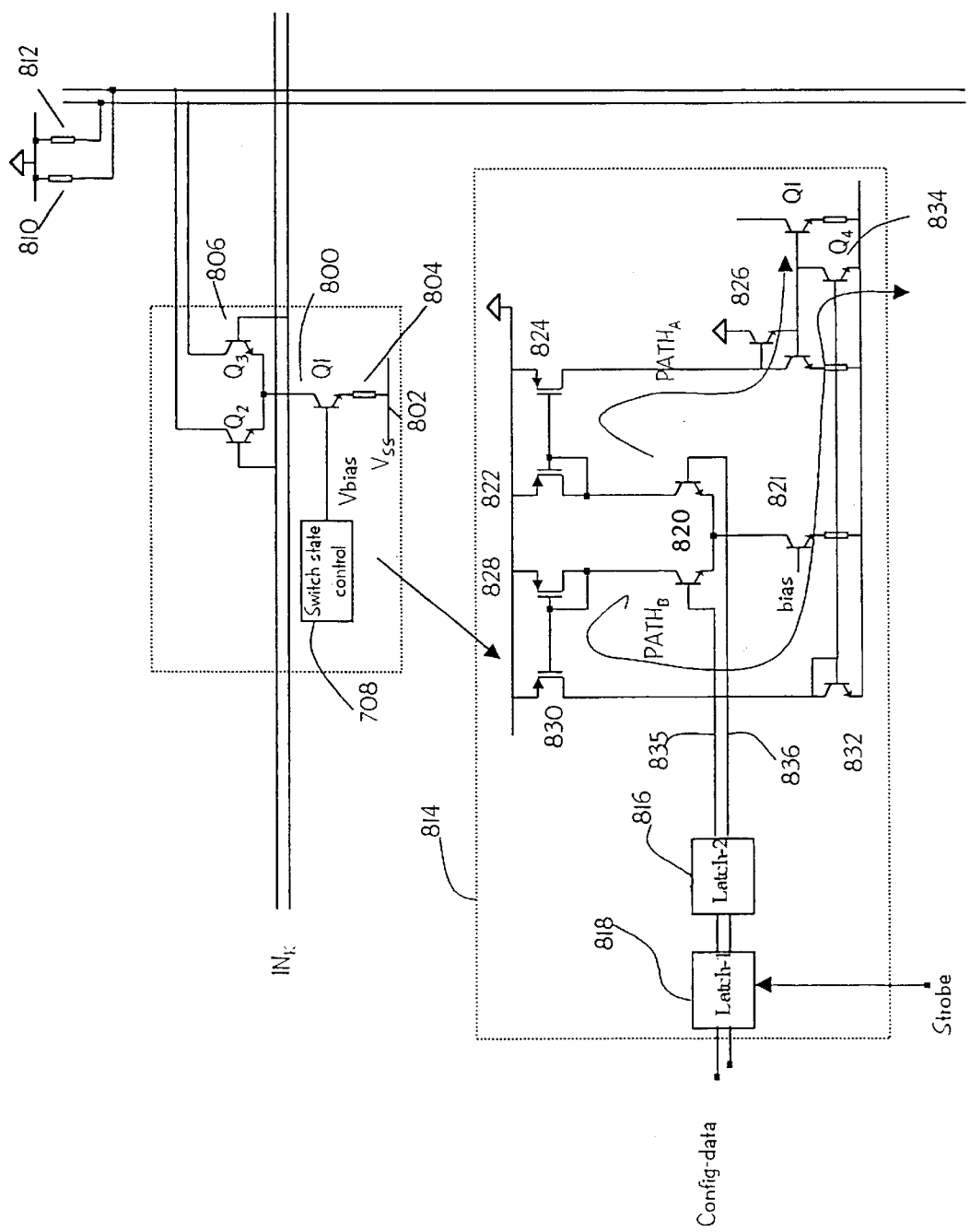
FIG. 8 is a diagram showing the structure of the switch cells and switch configuration control in the crosspoint switch of FIG. 7.

FIG. 8 illustrates the structure of the switch cells 704 and the manner in which the switch cells 704 are controlled by the switch configuration control and memory circuit 708. The switch configuration control and memory circuit 708 is represented in FIG. 8 by a block labelled "Switch State Control". Unlike the conventional matrix type crosspoint switch illustrated in FIG. 3, each of the switch cells 704 of the crosspoint switch of the presently described embodiment includes bias control circuitry and memory circuitry for controlling the bias state of the individual switch cores. The "Switch State Control" block 814 of FIG. 8 represents the bias control and memory circuitry for each individual switch core. As will be appreciated by those of ordinary skill in the art, while this circuitry is illustrated in FIG. 8 in block 814, the circuitry of block 814 is typically contained in the switch configuration control and memory circuit 708, which is described below.

To accommodate high speed applications, the switch core of the switch cells 704 are one-level differential amplifiers and the input signals and output signals comprise differential signals.

The switch core of each switch cell 704 has a bias transistor Q1 800 which has an emitter connected to a power source VSS 802 (which is ground potential in the embodiment shown in FIG. 8) through a resistor 804. The base of the bias transistor Q1 800 serves as a control terminal and is connected to a bias voltage $V_{bias}$ which is supplied by the bias (or switch configuration) control circuit 708 and has a level dependent upon the nature of the transistors used in the switching cell 704. The collector of the bias transistor Q1 800 is connected to a differential pair 806 comprised of transistors Q2 and Q3. In the differential pair 806, the transistor Q2 has its base connected to a respective one of the input terminals $IN_K$ through a corresponding input buffer 702 and its emitter connected to the collector of the transistor Q1. Transistor Q3 of the differential pair 806 has its base connected to the differential input terminal $IN_K$ through an input buffer 702 and its emitter connected to the collector of the transistor Q1. The collectors of the transistors Q2 and Q3 are connected to a respective one of the outputs $OUT_1$–$OUT_{16}$. The collectors of the differential pair of each of the switching cells are also tied to pull-up resistors 810 and 812, respectively. Each switch cell 704 connected to the same output has the same structure, and the outputs of each switch cell 704 connected to the same output line are thus arranged in a "wired OR" configuration. pull-up resistors 810 and 812, respectively. Each switch cell 704 connected to the same output has the same structure, and the outputs of each switch cell 704 connected to the same output line are thus arranged in a "wired OR" configuration.

The structure of the switch cell 704 in FIGS. 7 and 8 differs from that of a conventional array type crosspoint switch in that the switch cell 704 uses a single differential amplifier 806 to route an input signal to a selected output signal. In the conventional array type crosspoint switch shown in FIG. 3, for instance, a bottom differential amplifier is used to steer current from a top differential amplifier to selectively route an input signal to an output terminal (in a switch ON state) or to sink a source current (in a switch OFF state). In either case, the bias transistor Q1 300 of the conventional crosspoint switch cell remains ON and contributes to the large static power dissipation of the crosspoint switch.

In accordance with the present invention, substantial power savings are achieved by placing the bias transistor Q1 800 of the switch cell 704 in an OFF state when the switch cell is OFF (i.e., when no connection is made between an input and an output associated with the switch cell). To do this, the switch configuration control and memory circuit 708 serves to control the bias of the bias transistor Q1.

The switch configuration control and memory circuit 708 includes a bias control circuit illustrated in block 814 of FIG. 8. As shown, each switch cell 704 comprises the switch core described above and a control circuit having a pair of latches 816, 818. The control circuit includes a differential amplifier 820 biased by a bias transistor 821. The differential amplifier 820 is connected to a first latch circuit LATCH-1 816 through a second latch circuit LATCH-2 818 connected to an input of the first latch circuit LATCH-1 816. The differential outputs of the differential amplifier 820 are connected to a current follower circuit to provide a current through two distinct current paths. A first current path, PATH A, extends from differential amplifier 820 through a plurality of transistors 822, 824, 826 and into the bias transistor Q1 800. A second current path, PATH B, extends from the differential amplifier 820 through a plurality of transistors 828, 830, 832, and Q4 834 to ground.

The current configuration (ON or OFF state) of the switch is stored in the first latch circuit LATCH-1 816. The differential amplifier circuit 820 receives the switch state data and controls whether or not a bias is applied to the bias transistor Q1 800 of the switch cell 704 depending upon the current switch state data stored in the first latch circuit LATCH-1 816. If the output of the first latch circuit LATCH-1 816 is at a logic "1" level (e.g., the voltage at line 836 is higher than that at line 835), the differential amplifier 820 operates so that bias current is applied to the transistor Q1 by activating a first current path PATH A, while a second current path PATH B is off. When the output of the first latch circuit LATCH-1 816 is at a logic "0" level (e.g., when the voltage at line 836 is lower than that at line 835), PATH A is off and PATH B is on. PATH B ensures that transistor Q4 834 is turned ON, so that the bias current does not reach transistor Q1 800 and ensures that transistor Q1 remains OFF. The second latch circuit LATCH-2 818 is provided to simplify loading of the configuration data of the switch array. The inputs for loading the configuration are usually supplied on an 8 or 16 bit bus (larger buses increase the chip size and pin-count). Hence, the latches must be loaded in batches. Providing two latches per cell permits the loading of the second latch circuit LATCH-2 818 during the time data is routed through the switch. Once the loading of all latches is complete and the switch is ready for reconfiguration, all data for the second latch circuits LATCH-2 818 can be simultaneously transferred to corresponding first latch circuits LATCH-1 816 in one clock cycle. A strobe signal serves to accomplish this function, thus minimizing configuration time.

Accordingly, when a given switch cell is turned OFF, meaning that no data is to be transmitted through a cell, no bias current is applied to the switch cell, thereby enabling a substantial power savings.

As described above, high speed applications necessitate the application of a large bias current to the bias transistor Q1 800 to deliver the high switching speed necessary to satisfy the data transmission rate. Since changes in switch cell configuration may occur at speeds that are several orders of magnitude slower than the switching speed of the bias transistor, the transistors used to implement configuration and bias control may be much smaller and slower than the bias transistor Q1 800. Thus, the additional circuitry provided for each switch core 704 does not contribute substantially to the power dissipation of the switch core and is greatly outweighed by the reduction in static power dissipation achieved by deactivation of the bias transistor Q1 800.

The power savings offered by the above-described architecture will now be described.

A 16×16 crosspoint switch of the array type architecture has 256 individual switch cells. The total power dissipation of the entire crosspoint switch may be approximated by the following Equation (3):

Total Power Dissipation=$256 \times P_{diss}$ (each switch cell, including switch core and latches)+$P_{diss}$ (input and output buffers)+$P_{diss}$ (control and config. circuit)+$P_{diss}$ (bias circuits)    (3)

In high speed applications, the first factor, i.e., the power dissipation of the 256 switch cells, is the dominant factor contributing to total power dissipation of the crosspoint switch. This is because of the high current applied to the transistors of the switch core. In the present embodiment, although each switch cell 704 includes its own bias control circuit 814, as well as LATCH-1 and LATCH-2, the switch core itself comprises a single differential amplifier. Since the bias control circuit 814 and the latches are used for configuration purposes, these devices are preferably formed of low power semiconductor devices. The switch core, which must be able to handle the high bias currents needed to deliver high speed operation, is formed of larger transistors. Thus, while the device count of the switch cells 704 of the presently described embodiment is larger than that of the switch cores of the conventional crosspoint switch, the power dissipation is considerably lower due to the selective turning off of switches. Even though the device count of the inventive circuit is higher, the area increase of the chip is marginal due to the use of compact CMOS transistos for implementation of the transistors.

By turning OFF the bias transistor Q1 800 of a switch cell 704 when the switch cell is OFF in the manner described above, only active switch cores are biased. Thus, the total power consumption of the switch cells can be reduced to approximately 16 times the power dissipation of each switch cell. This is because, in a 16×16 crosspoint switch, a maximum of 16 switch cells can transmit input signals to outputs. Thus, at any given time, the bias transistors Q1 800 of a maximum of 16 switch cells are ON in the crosspoint switch of the presently described embodiment. Since it is formed of low power semiconductor devices, the bias control circuit 814 operates at a fraction of the current of the switch core (e.g., 100 µA for a switch core current of 2 mA), so that the power consumption of the bias control circuit 814 is negligible. Similarly, LATCH-1 816 and LATCH-2 818 are preferably implemented using CMOS techniques and thus consume negligible power only during the load phases. Accordingly, the combined power consumption contributed by the latch circuits and the bias controller is negligible when compared to the total power consumption of the switch cores. Thus, a crosspoint switch which consumes a small fraction of that consumed by a conventional architecture may be produced.

If a swing-limited architecture is used for implementation of the device, current consumption will depend on bias current. In addition to device size and fabrication parameters, the switching speed of the respective switch cores of the crosspoint switch is largely dependent upon bias current. In practice, since a configuration speed of a few tens of nanoseconds is adequate, a bias current of 100 μA per latch for a 0.35 μm technology is sufficient. The total power dissipation may be represented by the following Equation (4):

$$\text{Total Power Dissipation} = 16 \times I_{bias} \text{ (switch core)} \times VEE = 256 \times I_{bias\text{-}control} \times VEE + 2 \times 256 \times I_{bias\text{-}latch} \times VEE + P_{diss} \text{ (control and configuration memory, input and output buffers and bias circuits)} \quad (4)$$

wherein $I_{bias}$ (switch core) is the bias current of the bias transistor Q1 800, $I_{bias\text{-}control}$ is the bias current of the transistors in the bias control circuit, and $I_{bias\text{-}latch}$ is the bias current of the latch circuits. As can be readily seen from Equation (4), the most significant contributing factor to the total power dissipation of the crosspoint switch is reduced substantially by turning OFF the bias transistors of inactive switch cells.

In a conventional matrix type crosspoint switch operating at high speeds, capacitance is large since the input and output lines are connected to a large number of nodes. According to the present invention, however, several of the switch cores connected to an input may be biased OFF, so that the total capacitance to be driven by a buffer is set by the worst case loading, i.e, a broadcast mode:

Capacitance (total)=line capacitance+16×capacitance of each switch core

Moreover, in configurations where none of the switch cores driven by a particular input is ON, the total capacitance equals only the line capacitance. Under such circumstance the capacitance is inconsequential.

In some applications of the crosspoint switch 700, the input/output buffers are used at all times even if one or more of the switch cores is OFF. In SONET applications, for instance, all data paths are always kept busy by passing dummy packets. However, in other applications, the driving capacity of the input and output buffers can be adaptively changed based on the configuration data, so that the drive capability of the buffers is reduced when less power to drive an output line is needed. This can be achieved through the use of an adaptive bias control circuit for the input and output buffers driven by the configuration data.

Figure 9:
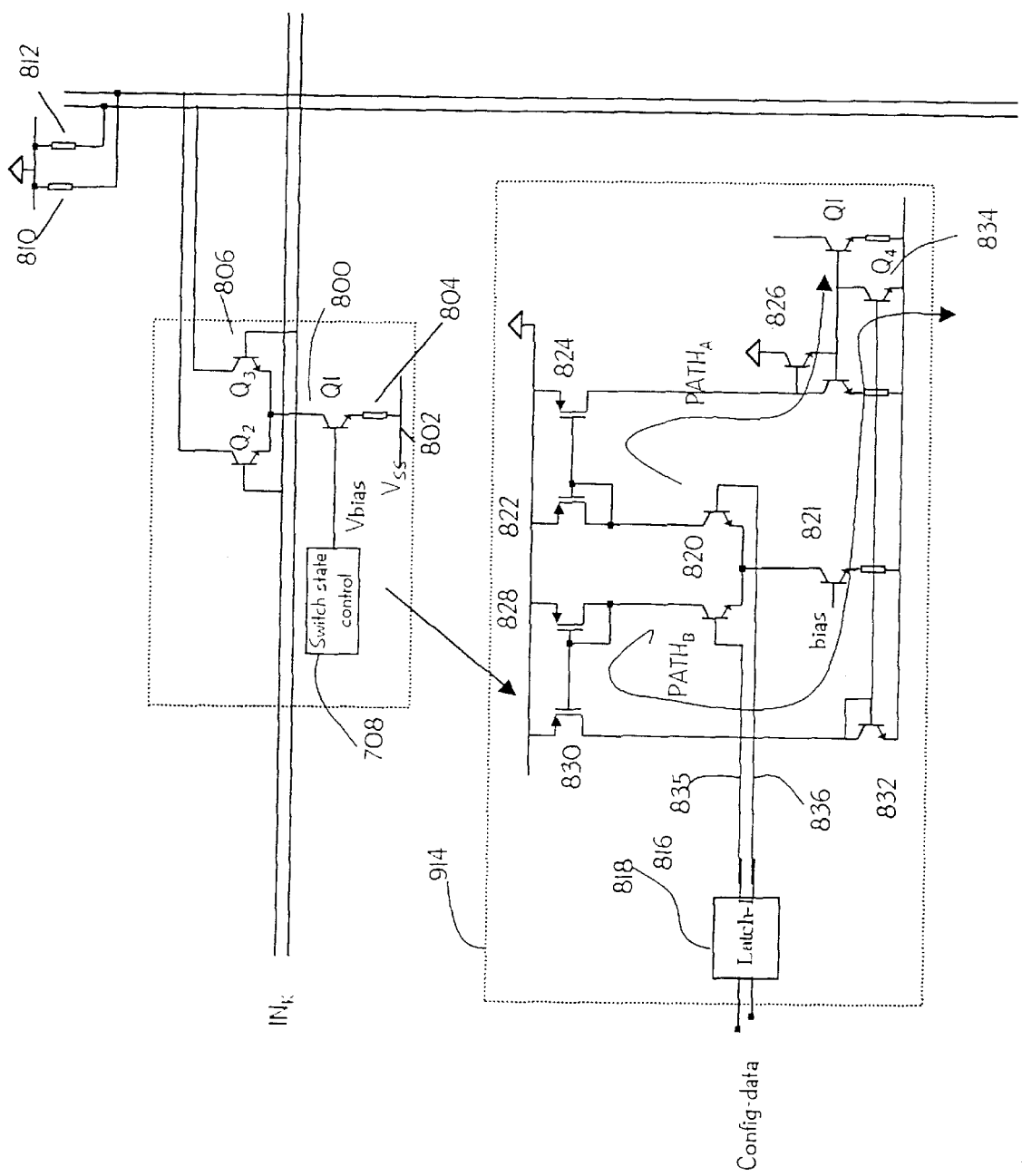
FIG. 9 is a diagram showing the structure of the switch cells and switch configuration control in accordance with a second embodiment of the present invention.

FIG. 9 illustrates a second embodiment of the switch core structure in a matrix type crosspoint switch. Elements which are the same or similar to those described above are identified with the same reference numerals and a description thereof is omitted.

In this embodiment, the circuit bias control circuit 914 lacks the second latch 816 of FIG. 8 so that memory storage of the configuration data is contained in the switch configuration control and memory circuit 708. In other respects, the embodiment of FIG. 9 functions in the same manner as FIG. 8.

While the precise amount of reduction in power dissipation achieved by the present invention will vary depending upon the fabrication technology and choice of power supply voltage levels, a major advantage of the present invention resides in its ability to reduce the power dissipation of a crosspoint switch operating in the gigabit per second range from several Watts to about 1 Watt. At a total power dissipation of 1 Watt, the cost of packaging is significantly reduced because active cooling techniques and ceramic packaging need not be used. Also, significant area that is normally taken up by power supply wires capable of carrying several Amperes of current can be saved. Systems fabricated using crosspoint switches according to the present invention can be smaller and less complex because chips may be closer together. Many recent SONET applications utilize 512×512 switches. While building such systems, a lower power dissipation part can make a big difference in cost and complexity. The inventive power saving bias control circuit reduces the size and capacitive and inductive loading of the conventional crosspoint switch.

While the present invention adds additional circuitry, increases the transistor count and the layout complexity of the crosspoint switch, the area in a high-speed chip is usually dominated by interconnections and pinouts. Hence, while additional area is needed to incorporate the individual bias control circuitry and memory circuitry for each switch-core, there is an overall size reduction in the crosspoint switch due to the reduction in interconnect size and pin count. Moreover, since cost is not a function of transistor count, but is a function of chip area, packaging and testing cost, the added transistor count of the present invention does not increase the cost or complexity of the device.

The embodiments of the invention described above are illustrative of the principles of the invention and are not intended to limit the invention to the particular embodiments described. For example, in other embodiments, circuits other than crosspoint switches may include bias control circuitry according to the principles of the present invention. In addition, other embodiments have switch cores that use a bias voltage instead of a bias current. The embodiments described can be easily modified by those skilled in the art without undue experimentation to cause the bias control circuitry to change the bias currents to disable such switch cores. Accordingly, the embodiments of the invention described above are illustrative of the principles of the invention and are not intended to limit the invention to the particular embodiments described. While the preferred embodiment of the invention has been illustrated and described, it will be appreciated that various changes can be made therein without departing from the spirit and scope of the invention.

I claim:

1. A matrix type crosspoint switch circuit comprising:

a plurality of input terminals;

a plurality of output terminals;

a plurality of input lines, each connected to a respective input terminal;

a plurality of output lines, each connected to a respective output terminal; and a switch circuit provided at each intersection of an input line and an output line, each switch circuit comprising a switch cell connected to an input line and an output line, a control terminal for controlling the state of the switch cell, and a bias control circuit coupled to the switch cell, the switch circuits being arranged so that an input signal at any one of the input terminals may be routed to any one of the output terminals in accordance with a signal input to the control terminal;

wherein the bias control circuit is configured to receive configuration information from an external controller and is responsive thereto to provide a control signal to the corresponding switch cell to enable the switch cell supplying a bias current thereto, or to disable the switch cell by supplying no bias current thereto, to reduce the static power dissipation of the switch cell.

2. A matrix type crosspoint switch circuit according to claim 1; wherein the control signal disables the switch cell when the configuration information indicates that the switch cell is turned OFF.

3. A matrix type crosspoint switch circuit according to claim 1; wherein the bias provided by the bias circuit is a bias voltage.

4. A matrix type crosspoint switch circuit according to claim 1; wherein each switch cell comprises a single differential transistor pair and a bias transistor, and each bias control circuit comprises a differential amplifier circuit separate from the differential transistor pair and having a control input configured to receive a signal and wherein in response to the signal the differential amplifier causes the bias voltage provided by the bias control circuit to change to a level that disables the switch cell.

5. A matrix type crosspoint switch circuit according to claim 1; wherein each switch cell comprises a bias transistor and a single differential amplifier connected to the bias transistor for routing an input signal at an input terminal to a respective output terminal in an ON state of the switch cell, and for turning OFF the bias transistor in an OFF state of the switch cell.

6. A matrix type crosspoint switch circuit according to claim 1; wherein each switch cell comprises a bias transistor and a single differential amplifier connected to the bias transistor for routing an input signal at an input terminal to a respective output terminal in an ON state of the switch cell, and for turning OFF the bias transistor in an OFF state of the switch cell; and wherein each bias control circuit comprises a differential amplifier circuit separate from the differential amplifier of the corresponding switch cell and having a control input configured to receive a signal and wherein in response to the signal the differential amplifier causes the bias current provided by the bias transistor of the corresponding switch cell to change to a level that disables the switch cell.

7. A matrix type crosspoint switch circuit according to claim 1; wherein a driving voltage of the crosspoint switch is no more than 3.3V.

8. A matrix type crosspoint switch circuit according to claim 1; wherein a driving voltage of the switch circuits is 2.5V.

9. In a high speed logic circuit having a switching circuit for routing data; wherein the switching circuit comprises a matrix type crosspoint switch circuit according to claim 1.

10. A matrix type crosspoint switch circuit according to claim 1; wherein each of the switch cells comprises a bias transistor having a base terminal connected to receive the control signal output by the bias control circuit and an emitter terminal connected to a power source voltage, and a single differential transistor pair having emitter terminals connected to a collector of the bias transistor, base terminals connected to a respective input line, and collector terminals connected to a respective output line.

11. A matrix type crosspoint switch circuit according to claim 10; wherein collector terminals of all of the differential transistor pairs connected to the same output line are joined together.

12. A matrix type crosspoint switch circuit according to claim 10; further comprising pull-up resistors connected to collector terminals of all of the differential transistor pairs.

13. A matrix type crosspoint switch circuit according to claim 1; wherein each bias control circuit comprises a differential amplifier separate from the differential transistor pair of the switch cells, and a current follower circuit for providing a first current path which prevents a corresponding switch cell from being turned on and a second current path which turns on the switch cell.

14. A matrix type crosspoint switch circuit according to claim 13; wherein the bias control circuit further comprises a memory circuit for storing a configuration state of the corresponding switch cell.

15. A matrix type crosspoint switch circuit according to claim 14; wherein the memory circuit comprises a first latch circuit for storing a current configuration state of the corresponding switch cell and a second latch circuit for storing a subsequent configuration state of the corresponding switch cell.

16. A crosspoint switch circuit comprising:
a plurality of input terminals;
a plurality of output terminals;
a plurality of input lines, each connected to a respective input terminal;
a plurality of output lines, each connected to a respective output terminal; and
a plurality of switch circuits each having a switch cell connected to the input lines and the output lines, a control terminal for controlling the state of the switch cell and a bias control circuit coupled to the switch cell and comprising a differential amplifier and a current follower circuit connected to the differential amplifier for providing a first current path which prevents the switch cell from being turned on and a second current path which turns on the switch cell, the switch circuits being arranged so that an input signal at any one of the input terminals may be routed to any one of the output terminals in accordance with a signal input to the control terminal;
wherein the bias control circuit is configured to receive configuration information from an external controller and is responsive thereto to provide a control signal to the corresponding switch cell to enable the switch cell by supplying a bias current thereto through the second current path, and to disable the switch cell by supplying current through the first current path when the configuration information indicates that the switch cell is turned OFF to thereby minimize loading capacitance, throughput delay and static power dissipation.

17. A crosspoint switch circuit according to claim 16; wherein the bias provided by the bias circuit is a bias voltage.

18. A crosspoint switch circuit according to claim 16; wherein each switch cell comprises a single differential transistor pair separate from the differential amplifier of the bias control circuit and a bias transistor connected to the differential transistor pair.

19. A crosspoint switch circuit according to claim 16; wherein each switch cell comprises a bias transistor and a single differential amplifier connected to the bias transistor for routing an input signal at an input terminal to a respective output terminal in an ON state of the switch cell, and for turning OFF the bias transistor in an OFF state of the switch cell.

20. A crosspoint switch circuit according to claim 16; wherein the switch circuits comprise multiplexers.

21. A crosspoint switch circuit according to claim 16; wherein each switch cell comprises a bias transistor and a single differential amplifier connected to the bias transistor for routing an input signal at an input terminal to a respective output terminal in an ON state of the switch cell, and for turning OFF the bias transistor in an OFF state of the switch cell; and wherein the bias control circuit comprises a differential amplifier circuit separate from the differential amplifier of the switch cell and having a control input configured to receive a signal and wherein in response to the signal the differential amplifier of the bias control circuit causes the bias current provided by the bias transistor of the corresponding switch cell to change to a level that disables the switch cell.

22. A crosspoint switch circuit according to claim 16; wherein a driving voltage of the switch circuits is no more than 3.3V.

23. A crosspoint switch circuit according to claim 16; wherein a driving voltage of the switch circuits is 2.5V.

24. In a high speed logic circuit having a switching circuit for routing data; wherein the switching circuit comprises a crosspoint switch circuit according to claim 16.

25. A crosspoint switch circuit according to claim 16; wherein each of the switch cells comprises a bias transistor having a base terminal connected to receive the control signal output by the bias control circuit and an emitter terminal connected to a power source voltage, and a single differential transistor pair separate from the differential amplifier of the bias control circuit and having emitter terminals connected to a collector terminal of the bias transistor, base terminals connected to a respective input line, and collector terminals connected to a respective output line.

26. A crosspoint switch circuit according to claim 25; wherein collector terminals of all of the differential transistor pairs connected to the same output line are joined together.

27. A crosspoint switch circuit according to claim 26; further comprising pull-up resistors connected to collector terminals of all of the differential transistor pairs.

28. A crosspoint switch circuit according to claim 16; wherein the bias control circuit further comprises a memory circuit for storing a configuration state of a corresponding switch cell.

29. A crosspoint switch circuit according to claim 28; wherein the memory circuit comprises a first latch circuit for storing a current configuration state of the corresponding switch cell and a second latch circuit for storing a subsequent configuration state of the corresponding switch cell.

* * * * *